(12) United States Patent
Lin et al.

(10) Patent No.: US 6,791,151 B2
(45) Date of Patent: Sep. 14, 2004

(54) BASE OF OPTOELECTRONIC DEVICE (75) Inventors: Ming-Der Lin, Hsinchu (TW);
Kwang-Ru Wang, Chia Yi (TW)

(73) Assignee: Highlink Technology Corporation, Hsinchu (TW)

( * ) Notice: Subject to any disclaimer, the term of this patent is extended or adjusted under 35 U.S.C. 154(b) by 0 days.

(21) Appl. No.: 10/336,792

(22) Filed: Jan. 6, 2003

(65) Prior Publication Data

US 2004/0070014 A1 Apr. 15, 2004

(30) Foreign Application Priority Data

Oct. 11, 2002 (TW) .......................... 91123524 A (51) Int. Cl.⁷ .................. H01L 31/0203; H01L 31/0232
(52) U.S. Cl. .................. 257/434; 257/432; 257/436
(58) Field of Search ................ 257/432, 434, 257/436

(56) References Cited

U.S. PATENT DOCUMENTS

| 4,692,662 | A | * | 9/1987 | Wada et al. | 313/493 |
| 5,057,735 | A | * | 10/1991 | Zalar et al. | 313/318.11 |
| 5,762,527 | A | * | 6/1998 | Liu et al. | 445/52 |
| 6,132,067 | A | * | 10/2000 | Scholz | 362/304 |
| 6,525,347 | B2 | * | 2/2003 | Matsuda | 257/184 |

* cited by examiner

Primary Examiner—Allan R. Wilson
(74) Attorney, Agent, or Firm—Sughrue Mion, PLLC (57) ABSTRACT A base of an optoelectronic device is disclosed. The present invention comprises an opening and a reflective surface. The base of the optoelectronic device incorporates with a transparent conductive substrate and an optoelectronic element to construct the optoelectronic device, wherein the optoelectronic element is disposed on the transparent conductive substrate, and the opening is used to hold the optoelectronic element. Moreover, the transparent conductive substrate is placed on the top of the opening, and the reflective surface is located at the bottom in the opening.

25 Claims, 7 Drawing Sheets

BASE OF OPTOELECTRONIC DEVICE

FIELD OF THE INVENTION

The present invention relates to a base of an optoelectronic device, and more particularly, to a base that can reflect light for an optoelectronic device, thereby promoting light emission intensity or increasing light reception intensity.

BACKGROUND OF THE INVENTION

Generally speaking, an optoelectronic device usually comprises an optoelectronic element, and the property of the optoelectronic device is closely related to that of the optoelectronic element. Currently, one of the most commonly-used optoelectronic elements is a diode, which can be roughly divided into a light-emitting element, such as a light-emitting diode (LED) chip, and a photosensitive element, such as a photo-detector or a solar cell, wherein the photo-detector can be a photodiode (PD) or a positive-intrinsic-negative (PIN) diode, etc.

Figure 1:
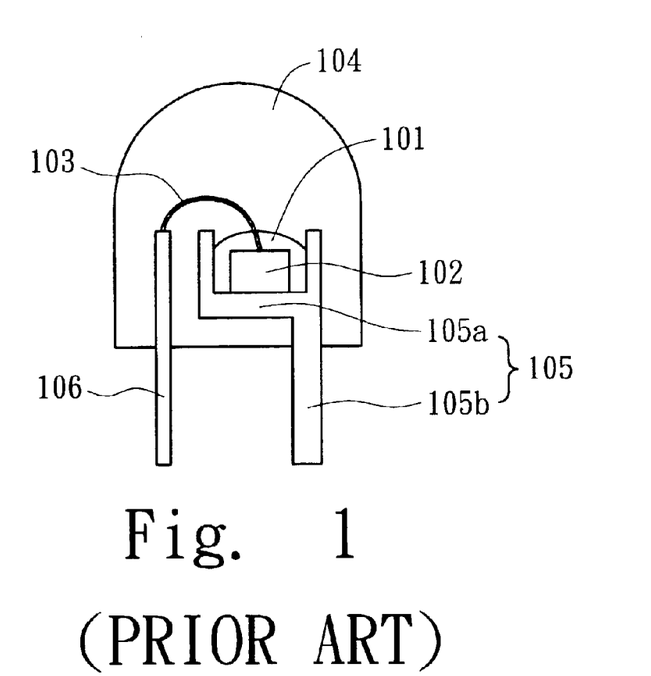
FIG. 1 illustrates the structure of a conventional LED.

Herein, a LED is taken as an example. Such as shown in FIG. 1, a LED comprises a coating resin 101, a LED chip 102, a conductive wire 103, a molding material 104, a lead frame 105 and an inner lead 106, wherein the lead frame 105 comprises a base 105a and a lead 105b. The description of the aforementioned LED structure can be referred to U.S. Pat. No. 5,998,925.

Such as shown in FIG. 1, the coating resin 101 is filled in the base 105a to cover the LED chip 102, so as to prevent the diode chip 102 from contacting oxygen or moisture, thereby protecting the LED chip 102. The coating resin 101 is generally made of transparent material, such as epoxy resin, urea resin or glass, etc. However, the thermal expansion coefficient and heat conductivity of the coating resin 101 are apparently different from those of the LED chip 102, so that the heat generated from the imperfect electro-optical conversion is easy to be accumulated on the interface between the coating resin 101 and the LED chip 102, while the optoelectronic element is in operation. Moreover, in the manufacturing process, it is quite important about how to use proper temperature and process for the coating resin 101 to be stably coated on or filled in the area surrounding the LED chip 102, and meanwhile, to assure that no extra chemical reaction between two different materials (the coating resin 101 and the LED chip 102) will occur. However, with the current technology, it usually needs to perform a baking step on the coating resin 101 at 150° C. for about 40 minutes, so as cure the coating resin 101. Hence, for fitting to the current process, the coating resin 101 of high purity has to be selected as the material used for coating or filling (since some elements are easy to be diffused into semiconductor material to change the original properties of the semiconductor material).

The aforementioned structure also causes another bad influence. As the coating resin 101 is a poor heat conductor, heat is accumulated on the interface between two different materials (the coating resin 101 and the LED chip 102). Due to the difference in the thermal expansion coefficients between the coating resin 101 and the LED chip 102, while the element is in operation, heat accumulated therein causes additional stress exerted on the LED chip 102, wherein the stress is exactly proportional to the interface temperature (which is caused by the accumulated heat). While LED elements are developed towards the applications of high brightness and high power, the aforementioned problem will become more and more serious. Even on the current common applications, since the coating resin 101 and the LED chip 102 are different in material properties, the operation stability and life of the optoelectronic elements are affected directly or indirectly.

Figure 2:
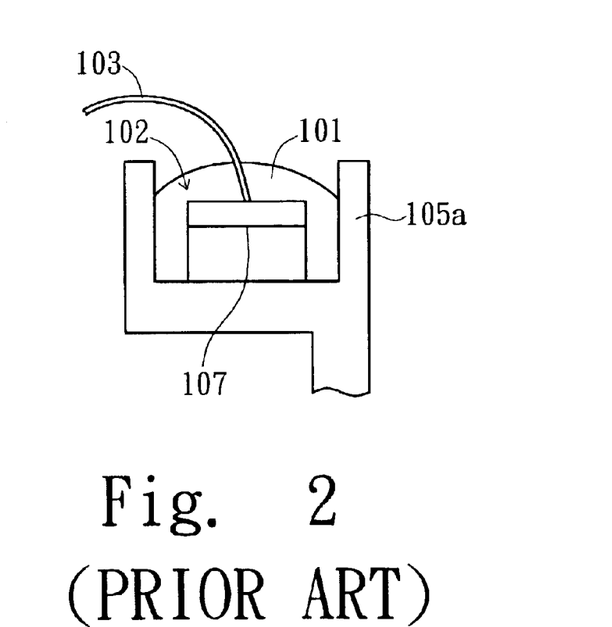
FIG. 2 is a detailed diagram showing the base portion of the conventional LED.

Further, please refer to FIG. 2, which is a detailed diagram showing the elements around the base 105a, wherein the LED chip 102 is a semiconductor element having a PN junction 107. Hence, when a positive voltage is applied to two electrodes of the LED chip 102, the light of light of specific wavelength will be emitted from the PN junction 107 of the LED chip 102. In the aforementioned structure, the light emitted by the LED chip 102 towards the base 105a cannot be emitted again to the external, and thus the light emission intensity and efficiency of the entire LED device are affected. However, under the current structure, these shortcomings are inevitable.

Such as shown in FIG. 2, the coating resin 101 is used to fill in the base 105a to cover the LED chip 102, and the coating resin 101 may comprise fluorescent matter, such as phosphor. Besides, the coating resin 101 can be transparent material, such epoxy resin, urine resin or glass, etc. Moreover, the fluorescent matter contained in the coating resin 101 can change the light emission wavelength by the way of energy conversion, and the porosity and coating thickness of the fluorescent matter also affect the color of the colored light emitted after the wavelengths respectively generated by the LED and the fluorescent matter are mixed. However, on one hand, due to the oxidization reaction and the deterioration scheme of the coating resin 101 itself, and on the other hand, due to the temperature influence and the UV light irradiation, the deterioration of the coating resin 101 and phosphor is thus accelerated. When the coating resin 101 is deteriorated and cured because of heat, or is damaged by the UV light in sunshine, the coating resin 101 has the phenomenon of curing and deteriorating. Once the coating resin 101 starts deteriorating, the LED chip 102 covered thereby will be affected and damaged. Especially for the element of which the waveband of light emitted is below that of blue light (wherein the wavelength of emitted light is smaller than 480 nm), because the LED chip thereof has the attribute of spontaneous light-emission, and additionally, the light traveling path thereof is concentrated within a specific angle, resulting in high light emission intensity, consequently, the damage to the coating resin is more sever. With the occurrence of these situations, the LED device has the chance to be functionally retarded.

Please refer FIG. 1 again. In the process for manufacturing the conventional LED, the LED chip 102 has to first be fixed on the base 105a. Thereafter, the conductive wire 103 is formed between the LED chip 102 and the inner lead 106 in a manner of wiring. Then, the coating resin 101 is filled in the base 105a to cover the LED chip 102 and part of the conductive wire 103. However, errors may occur in the process of fixing the LED chip 102, and the conductive wire 103 may not be able to be formed accurately on the bonding pad of the LED chip 102 while being formed on the LED chip 102, thus causing the LED chip 102 to be electrically nonconductive, resulting in manufacturing a defective LED.

Figure 3:
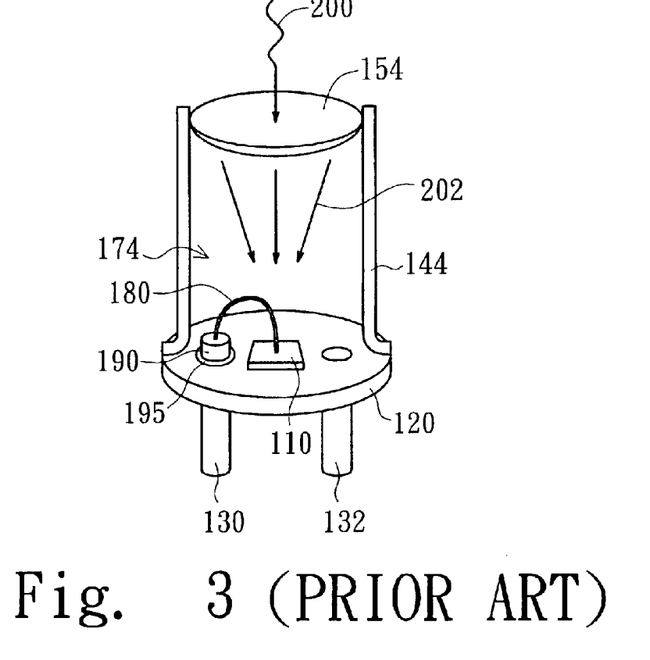
FIG. 3 is a schematic diagram showing a conventional LED of TO-CAN type.

On the other hand, as to a photosensitive element, the photosensitive element can be a photodiode, a PIN diode, a photo crystal or a solar cell. Referring to FIG. 3, FIG. 3 is a schematic diagram showing a conventional photodiode of TO-CAN type. FIG. 3 illustrates a photodiode 110, a base 120, a lead pin 130, a lead pin 132, a metal cover 144, a light-emitting window 154, a conductive wire 180, a soldering pad 190 and an insulation part 195, etc., wherein the photodiode 110 is fixed on one surface of the base 120, and the lead pin 130 and the lead pin 132 are connected to the other surface of the base 120 for transmitting electrical signals.

As to the metal-can packaging of the photodiode 110, it means that the metal cover 144 is fitted to the base 120, so as to protect the photodiode 110. Besides, the light-emitting window 154 is inset into the upper surface of the metal cover 144, so that, when the metal cover 144 is fitted to the base 120, an incident light 200 from the external can pass through the light-emitting window 154 and is refracted to become an incident light 202, which is further focused on the photodiode 110. Further, when the metal cover 144 is fitted to the base 120, a space 174 is formed between the metal cover 144 and the base 120, wherein the photodiode 110 is located in the space 174. Moreover, one electrode of the LED 110 is electrically connected to the lead pin 130 via the conductive wire 180, and the other electrode of the photodiode 110 is electrically connected to the lead pin 132 via the base 120. Besides, the insulation material 195 is used for isolating the lead pin 130 from the base 120.

The photodiode 110 is a diode that is sharply sensitive to light. When the light irradiates the photodiode 110, the reverse-current of the photodiode 110 will be enlarged, particularly when the photodiode 110 is mostly operated under the condition of reverse bias, wherein it has to be noted that: since the photodiode 110 is a passive element, if the intensity of the incident light 202 emitted to the photodiode 110 is too low, the noise measured from the photodiode 110 will be very large i.e. the signal/noise ratio (S/N Ratio) will be extremely low. Hence, it is a quite important topic about how to design a better structure of packaging to the best possibility for promoting the operation efficiency of the photodiode 110 of photosensitive type, thereby achieving the purpose of photo-detection.

However, the aforementioned photosensitive element of TO-CAN type has the shortcomings described as follows. At first, the light-emitting widow allowing light to enter is not large on the front-side of the photosensitive element of TO-CAN type. Secondly, upon the front-side light being emitted to the surface of the photosensitive element of TO-CAN type, the light reflected thereby is very strong. Moreover, the total reflection will result in the loss of the incident light. Thus, the incident light intensity actually emitted to the photosensitive element becomes very small due to all kinds of loss. Further, because the light emitted to the photodiode is not focused, therefore, even if the light can smoothly pass through the light-emitting window of TO-CAN to the photodiode, the light still cannot be concentrated totally on the sensing area of the photodiode since the light is too divergent. Hence, if the signal intensity from the sample to be tested is very low, the photodiode will not be able to perform light detection normally, due to the insufficient intensity of incident light received by the photodiode (i.e. the S/N ratio is too low).

To resolve the problems of sever loss and over divergence for the incident light, the process or the structure of the photodiode can be modified. For example, in U.S. Pat. No. 6,278,145, it is stated that the semiconductor manufacturing process of the photodiode has to be modified, but it is not taught that, by means of new design, the optimized structure of the photosensitive element is used to promote the operation efficiency of the element. Hence, even partial improvement of the process is obtained, yet due to the restriction of structural deficiency, so that the overall efficacy of the optoelectronic device still cannot be promoted greatly and effectively.

To sum up, for the current development of optoelectronic devices, it is a difficult problem about, how to provide a base of an optoelectronic device to efficiently direct the light emitted by the light-emitting element to the external of the device, thereby promoting the external efficiency of an active-typed optoelectronic device; or how to effectively concentrate the light emitted to the optoelectronic device on a passive-typed optoelectronic element, so as to increase the sensitivity of the passive-typed optoelectronic device, and also to prevent the light-emitting element or photosensitive element from being damaged by the coating resin, thereby promoting the operation stability and life of the optoelectronic device.

SUMMARY OF THE INVENTION

For overcoming the conventional problems described in the aforementioned background, one object of the present invention is to provide a base of an optoelectronic device, so as to efficiently emitting light to the external from the optoelectronic device for increasing the light emission efficiency thereof, wherein the light is emitted from an active-typed optoelectronic element.

Another object of the present invention is to provide a base of an optoelectronic device, so as to efficiently concentrate the light emitted to the passive-typed optoelectronic device on a passive-typed optoelectronic element for increasing the sensitivity thereof.

Another object of the present invention is to provide a base of an optoelectronic device, so as to prevent an optoelectronic element from being damaged by a coating resin, thereby increasing the operation stability and life of the optoelectronic device.

To achieve the aforementioned objects, the base of the optoelectronic device of the present invention matches up with a transparent conductive substrate and an optoelectronic element disposed on the transparent conductive substrate to form an optoelectronic device. According to the present invention, the base of the optoelectronic device comprises a reflective surface and a base main body having an opening, wherein the opening is used for accommodating an optoelectronic element, and the reflective surface is located at the bottom of the opening. Just as described above, the optoelectronic element is contained in the opening, and while in the opening, the optoelectronic element can be held in a manner of suspending from the reflective surface, or contact the reflective surface. Besides, a transparent conductive substrate covers the top of the opening so as to seal the opening, so that the optoelectronic element can be disposed in a closed space for protection.

Hence, when the optoelectronic element is a LED, if the transparent conductive substrate uses the material that is transparent under the light emission waveband, then the light can be directly emitted upwards from the LED, or also can be first emitted downwards and then reflected by the reflective surface, or can be emitted upwards and downwards simultaneously and then reach the outside of the conductive substrate via the reflective surface. When the optoelectronic element is a photosensitive element, it can receive the light emitted directly thereto or the light reflected by the reflective surface; or can simultaneously receive the light directly thereto and the light reflected by the reflective surface.

Further, the base of the optoelectronic device of the present invention comprises a light-reflective layer formed on an inner wall of the opening.

Moreover, the base of the optoelectronic device of the present invention further comprises a florescent layer formed on the reflective surface, wherein the florescent layer can change the wavelength of the light emitted to the reflective surface.

Or, the base of the optoelectronic device of the present invention may further comprise a light-reflective layer formed an inner wall of the opening, and a florescent layer formed on the reflective surface at the same time, wherein the florescent layer can change the wavelength of the light emitted to the reflective surface.

Further, the base of the optoelectronic device of the present invention further comprises a first electrode part and a second electrode part, wherein the first electrode part and the second electrode part are formed respectively on two sides of the base, so as to be electrically connected to two electrodes of the transparent conductive substrate respectively.

When the base of the optoelectronic device of the present invention is applied to an active-typed optoelectronic element, the base can use the reflective surface to effectively reflect the light outwards except the light emitted to the front side by the active-typed optoelectronic element, thereby avoiding the problem that the conventional structure suffers the loss of the light emitted to the rear side (referring to FIG. 1 and FIG. 2), so as to increase the light emission efficiency of the LED. When the base of the optoelectronic device of the present invention is applied to a passive-typed optoelectronic element, the base can use the reflective surface to effectively change the path of the reflected light, and to concentrate all the receivable light to the direction towards a photosensitive element, thus increasing the sensitivity of light detection (high S/N ratio). As to the base of the optoelectronic device of the present invention, the optoelectronic element is disposed in the opening, and the transparent conductive substrate covers the opening, so that no coating resin is needed, thus preventing the optoelectronic element from being damaged by the coating resin.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Hereinafter, a base of an optoelectronic device is explained by referring to the related figures, according to preferred embodiments of the present invention, wherein same reference numbers are used for the same elements for explanation.

Figure 4:
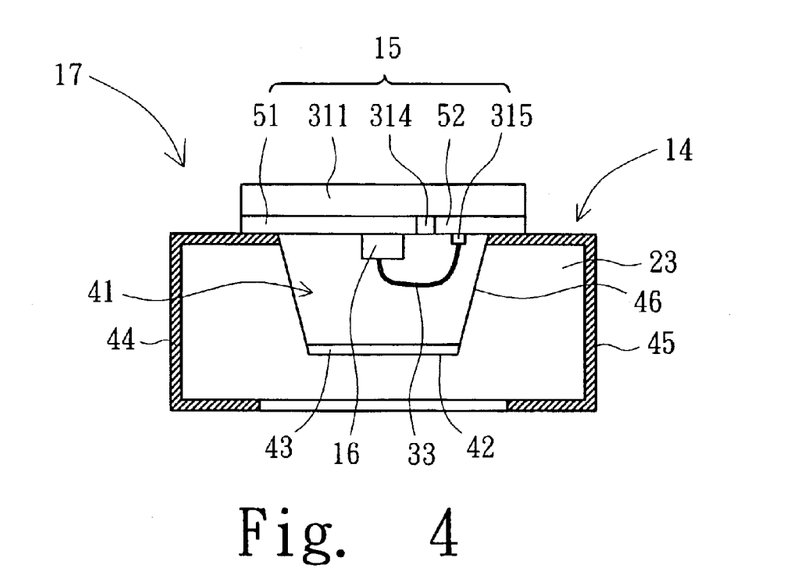
FIG. 4 is a schematic diagram showing an optoelectronic device constructed from the coordination of a base of the optoelectronic device, an optoelectronic element and a transparent conductive substrate, according to a preferred embodiment of the present invention.

Referring to FIG. 4, FIG. 4 is a schematic diagram showing an optoelectronic device constructed from the coordination of a base of the optoelectronic device, an optoelectronic element and a transparent conductive substrate, according to a preferred embodiment of the present invention. A base 14 shown in FIG. 4 comprises an opening 41 and a reflective surface 42. An optoelectronic device 17 is constructed from the coordination of the base 14, a transparent conductive substrate 15 and an optoelectronic element 16. Further, the transparent conductive substrate 15 comprises a transparent plate 311, a first electrode 51, a second electrode 52, an insulation part 314 and a soldering pad 315, which are stacked and arranged as shown in FIG. 4.

Continuously from the above, the opening 41 can accommodate the optoelectronic element 16, and the reflective surface 42 is located at the bottom of the opening 41. Hence, when the optoelectronic element 16 is a light-emitting element, the reflective surface 42 can reflect the light emitted by the optoelectronic element 16 to increase the light emission intensity of the optoelectronic device 17; when the optoelectronic element 16 is a photosensitive element, the reflective surface 42 can reflect the light emitted to the optoelectronic device 17 intensively on the optoelectronic element 16 to increase the photosensitivity of the optoelectronic device 17. When the base 14 sustains the transparent conductive substrate 15, the optoelectronic element 16 is located in the opening 41 and between the transparent conductive substrate 15 and the reflective surface 42, wherein the optoelectronic element 16 can be held with contacting the reflective surface 42 (in a manner of suspending from the reflective surface 42), or can contact the reflective surface 42.

It has to be noted that the optoelectronic element 16 can be an active optical element, such as a light-emitting element, or can be a passive optical element, such as a photosensitive element or a solar cell. For example, as a photosensitive element, it can be arbitrarily a photodiode, an organic light-emitting diode (OLED) or a laser diode, etc.

Further, according to the preferred embodiment of the present invention, the base 14 of the optoelectronic device further comprises a florescent layer 43 formed on the reflective surface 42. The florescent layer 43 can change the wavelength of the light emitted to the reflective surface 42, so as to change the light emission color of the optoelectronic device 17. The material forming the base 14 can be ceramic material, metal material, alloy material, crystalline material or semiconductor material, etc. The florescent layer 43 contains florescent material, such as phosphor, and the porosity and thickness of the florescent material contained in the florescent layer 43 can affect the color of the light emitted from the optoelectronic device 17, thereby enabling the optoelectronic device 17 to emit the light in the color of such as white, pink or red, etc.

Besides, the base 14 further comprises a first electrode part 44 and a second electrode part 45, wherein the first electrode part 44 and the second electrode part 45 are respectively formed on two sides of the base main body 23, so as to be electrically connected to a first electrode 51 and a second electrode 52 of the transparent conductive substrate 15. Further, the optoelectronic element 16 is electrically connected to a soldering pad 315 via a conductive wire 33, and the soldering pad 315 is fixed on the surface of the second electrode 52.

For example, the first electrode part 44 and the second electrode part 45 can be surface mounted devices (SMD) formed by using the surface mounting technology (SMT). Hence, when the transparent conductive substrate 15 is installed on the base 14, the first electrode 51 contacts the first electrode part 44, and the second electrode contacts the second electrode part 45. The first electrode part 44 is further electrically connected to a negative electrode (not shown) of the external, and the second electrode part 45 is electrically connected to a positive electrode (not shown) of the external. Therefore, when the first electrode part 44 and the second electrode part 45 are respectively applied with a negative voltage and positive voltage, the first electrode 51 and the second electrode 52 can be electrically conducted immediately. Also, when the optoelectronic element 16 is a light-emitting element, electricity is conducted to two electrodes of the optoelectronic element 16 for emitting light. Those who are skilled in the art should be able to understand that the optoelectronic element 16 can be normally operated under the condition of forward bias (such as an active-typed optoelectronic element) or reverse bias (such as a passive-typed optoelectronic element) according to the operation characteristic of the optoelectronic element 16.

It is worthy to be noted that, besides the first and second electrode parts 44 and 45 having the form of SMD, the optoelectronic device 17 can also be a LED lamp, a LED backlight, a LED high power package, or a LED cell (COB LED), etc. Since the present invention has special structures, and additionally adopts several designs of dissipating heat and guiding light, the present invention is thus very suitable for use in packaging the elements of high power and high light emission efficiency.

Besides, according an optoelectronic device of a preferred embodiment of the present invention, a space of the opening 41 in the base 14 can be filled with gas, such as air, nitrogen and inert gas, or can be at vacuum stat. When the space in the opening 41 is filled with gas to form a gas-tight structure, the conventional coating resin 101 can be prevented from being deteriorated by light or heat when the coating resin 101 shown in the aforementioned FIG. 2 directly covers the surface of the LED chip 102. Hence, the direct damage on the optoelectronic element 16 can be avoided. Those who are skilled in the art should be able to understand that the space in the opening 41 also can be filled partially with the material containing florescent material, or with colloid having scattering function, so as to achieve the function of changing light emission wavelength or efficacy.

Figure 6:
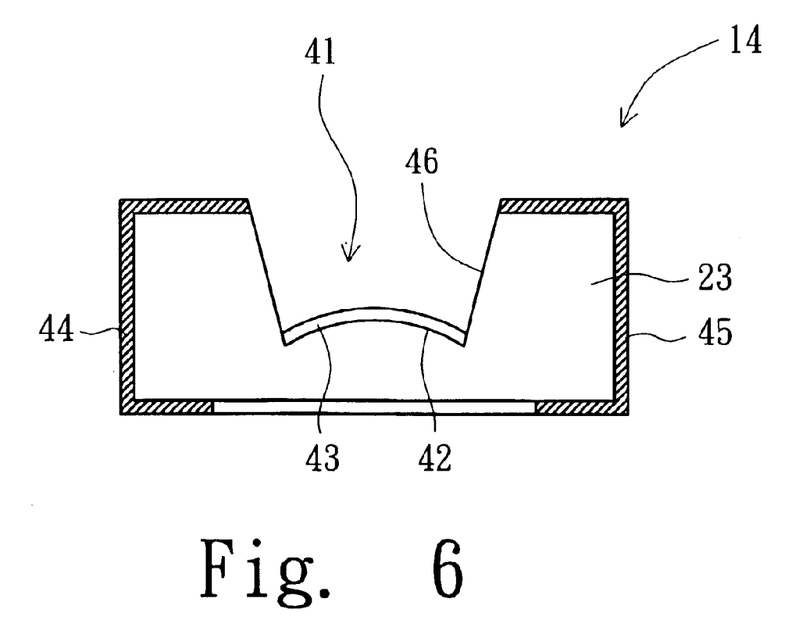
FIG. 6 is a schematic diagram showing a base of an optoelectronic device, according to another preferred embodiment of the present invention, wherein the reflective surface is a convex curved surface.
Figure 7:
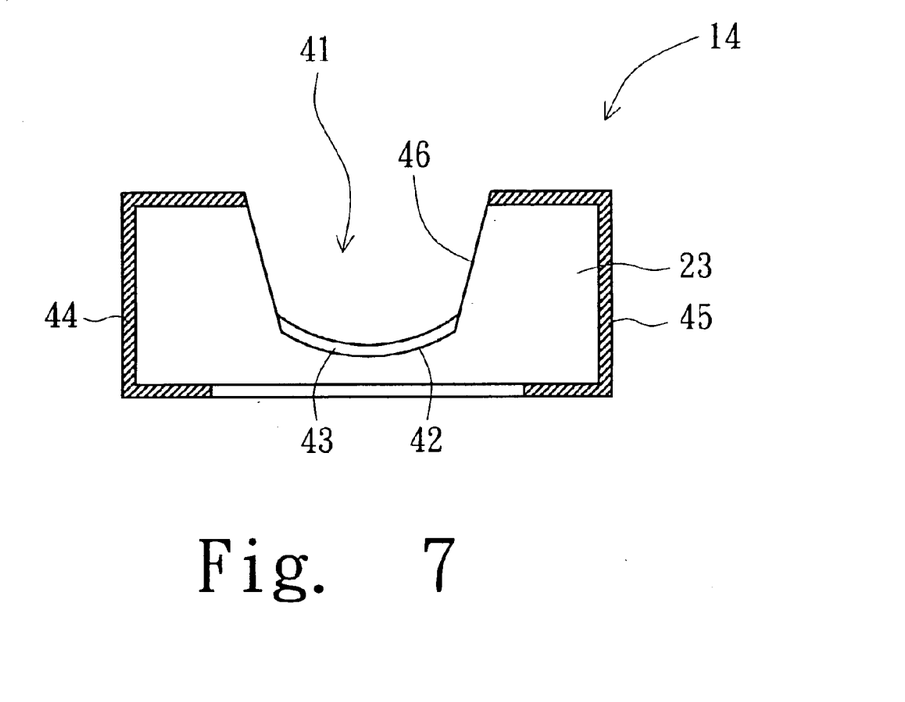
FIG. 7 is a schematic diagram showing a base of an optoelectronic device, according to another preferred embodiment of the present invention, wherein the reflective surface is a concave curved surface.
Figure 8:
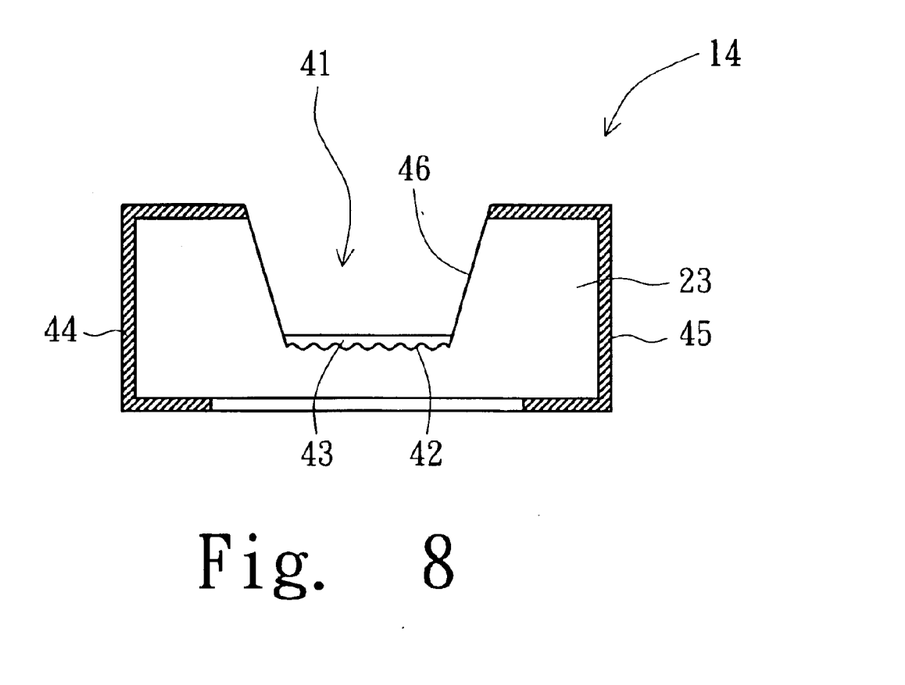
FIG. 8 is a schematic diagram showing a base of an optoelectronic device, according to another preferred embodiment of the present invention, wherein the reflective surface is a grating curved surface.

Moreover, the base 14 further comprises a light-reflective layer 46 formed on the inner wall of the opening 41. The light-reflective layer 46 is used to reflect light, and the light-reflective layer 46 and the reflective surface 42 can be orthogonal to each other (not shown), or not orthogonal (such as shown in FIG. 4) thereto. In other words, without violating the scope of the inventive spirit of the present invention, those who are skilled in the art should be able to design the opening 41 of different shapes. For example, the inner wall of the opening 41 can be an inner wall 48 (shown in FIG. 5) of stair shape, the reflective surface 42 can be a convex curved surface (shown in FIG. 6), a concave curved surface (shown in FIG. 7) or a grating curved surface (shown in FIG. 8).

Figure 5:
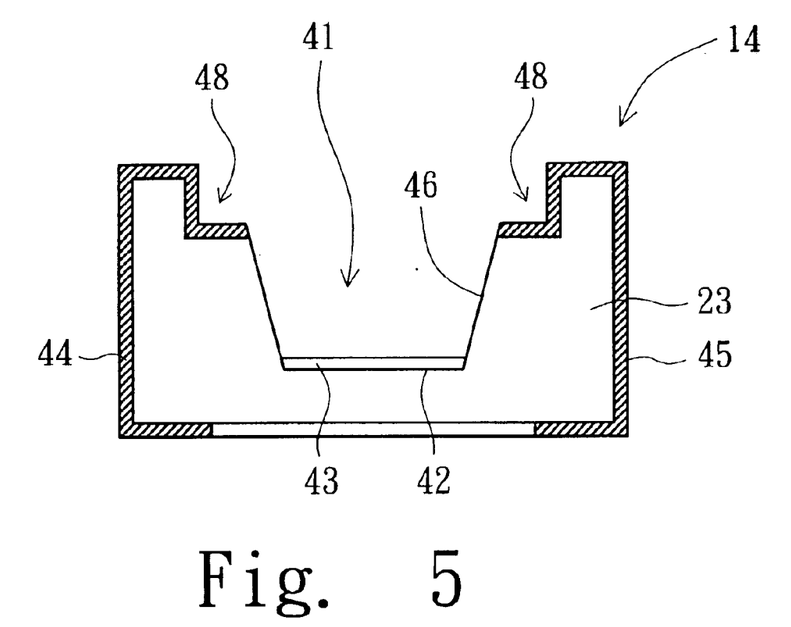
FIG. 5 is a schematic diagram showing a base of an optoelectronic device, according to another preferred embodiment of the present invention, wherein the cross-section of the base is a stair shape.

Such as shown in FIG. 5, if the opening 41 has the inner wall 48 of stair shape, and the transparent conductive substrate 15 shown in FIG. 4 is disposed on the base 14, the transparent conductive substrate 15 can cover the top of the opening 41 in a self-aligning manner, thereby conveniently implementing the transparent conductive substrate 15.

Figure 9:
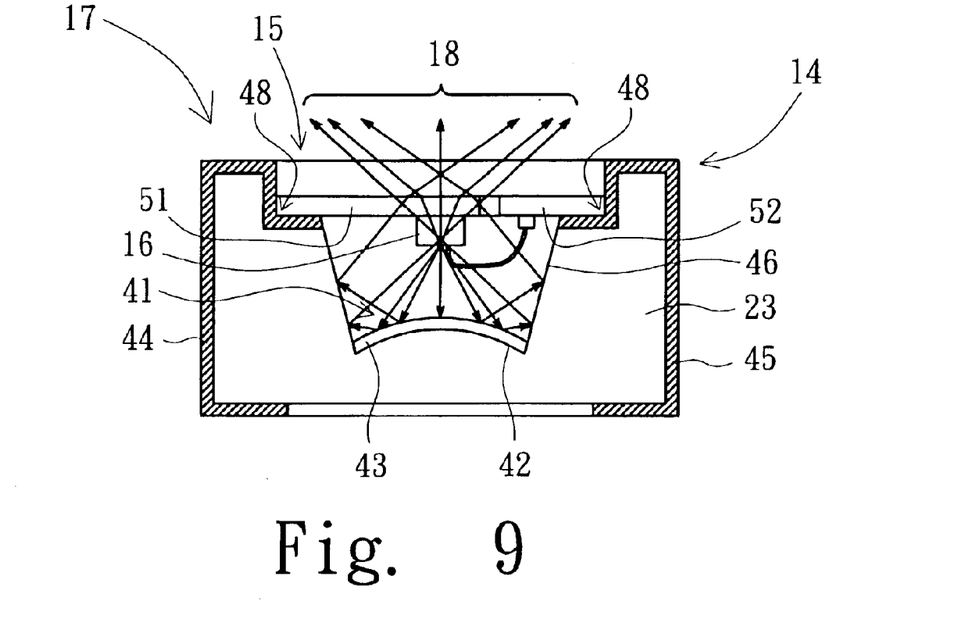
FIG. 9 is a schematic diagram showing an optoelectronic device constructed from the coordination of a base of the optoelectronic device, an optoelectronic element and a transparent conductive substrate, according to another preferred embodiment of the present invention, wherein the reflective surface is a convex curved surface, and the cross-section of the base is a stair type.

Please refer to FIG. 9. When the reflective surface 42 use a convex curved surface of which the central portion is bulgy, the reflective surface 42 can change the emission path of the reflected light. Additionally, with the assistance of the light-reflective layer 46, the chance for the emitted light to leave the base 14 is great enhanced. This design is highly applicable to the active-typed optoelectronic element. Such as shown in FIG. 9, when the optoelectronic element 16 is an active-typed optoelectronic element, most of the light emitted from the optoelectronic element 16 leaves the base 14 along an emission path 14 via the reflection function of the light-reflective layer 46 and reflective surface 42, thereby promoting the emission efficiency of the light emitted from the optoelectronic element 16.

Figure 10:
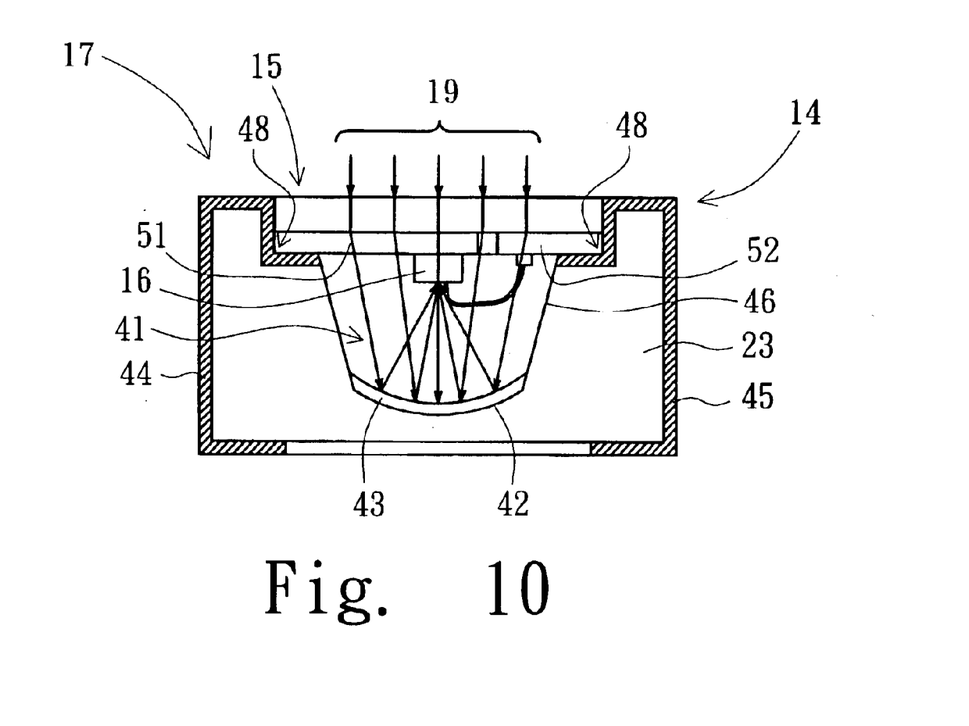
FIG. 10 is a schematic diagram showing an optoelectronic device constructed from the coordination of a base of the optoelectronic device, an optoelectronic element and a transparent conductive substrate, according to another preferred embodiment of the present invention, wherein the reflective surface is a concave curved surface, and the cross-section of the base is a stair type.

Please refer to FIG. 10. When the reflective surface 42 is a concave curved surface of which the central part is recessed, this design can collect the light emitted into the base 14, and emit the light intensively to the optoelectronic element 16 to increase the photosensitivity of the optoelectronic device 17. In other words, in the conventional technology shown in FIG. 3, if the light emitted to the photodiode 110 is very weak, the photodiode 110 then cannot be effectively actuated. However, when the weak light of the same intensity is emitted to the optoelectronic device 17 having the base 14 as shown in FIG. 10, since the base 14 of the present invention has a special light-collecting design, the optoelectronic element 16 still can have the function of light detection under such an inferior condition. Hence, the base 14 with this special design is particularly suitable for use in a passive-typed optoelectronic element. The reflective surface 42 shown in FIG. 10 is a concave curved surface, and the cross-section of the base 14 is the inner wall 48 of stair shape. Such as shown in FIG. 10, when the photosensitive element 16 is a passive-typed optoelectronic element, most of the light emitted to the base 14 is accumulated o the optoelectronic element 16 along an incident path 19 via the reflection function of the light-reflective layer 46 and reflective surface 42, thereby promoting the light-detecting efficiency of the optoelectronic element 16.

To sum up, according to the preferred embodiments of the present invention, by using the reflective surface 42, the base 14 of the optoelectronic device can reflect out the light that is emitted downwards from the optoelectronic element 16, so as to increase the light emission efficiency of the optoelectronic device 17, or can collect the light emitted to the optoelectronic device 17 and then reflect the light intensively to the optoelectronic element 16, thereby increasing the sensitivity of the optoelectronic device 17. Further, since the space in the opening 41 can be filled with gas, the optoelectronic element 16 can be prevented from being damaged by the coating resin.

Besides, the space in the opening 41 can further be filled with any non-conductive liquid that can assist the heat dissipation. Particularly, when the space in the opening 41 is filled with the heat-dissipating material such as electrically non-conductive liquid, the naturally cooling effect will be achieved due to heat convection. When the space in the opening 41 is filled with liquid, the liquid can be the material having proper refraction index, and additionally, the technology of refractory index matching can be used to increase the light emission efficiency. For example, the combination of liquid $TiO_2$ of which the refraction index is about 2.0 and deionized water (DI Water) of which the refraction index is about 1.5, will have better effect than epoxy resin of which the refraction index is about 1.4, the former also can enhance the heat-dissipation effect. Or, the DI water can also be wrapped in soft gel to form a sealed space filled in the space of the opening 41, thereby attaining the purpose of dissipating heat and increase the effect of light emission.

Figure 11:
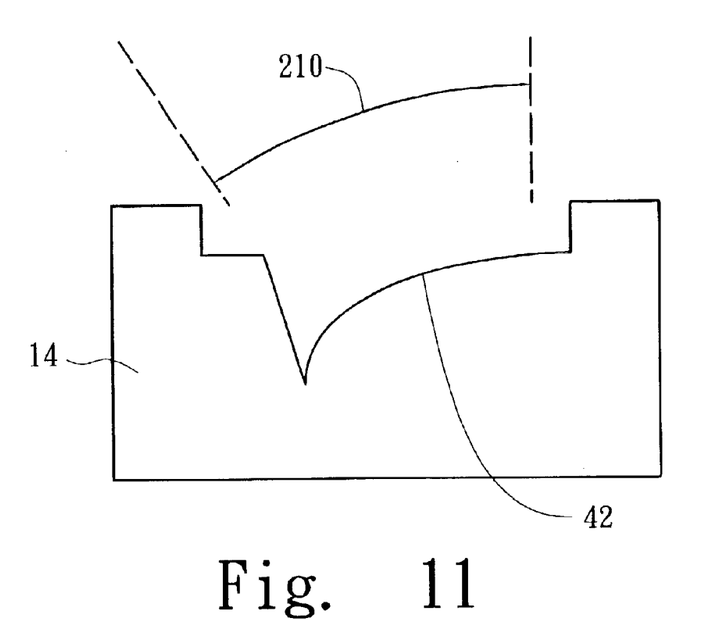
FIG. 11 is a schematic diagram showing a base of an optoelectronic device, according to another preferred embodiment of the present invention, wherein the reflective surface is a semiconvex curved surface.
Figure 12:
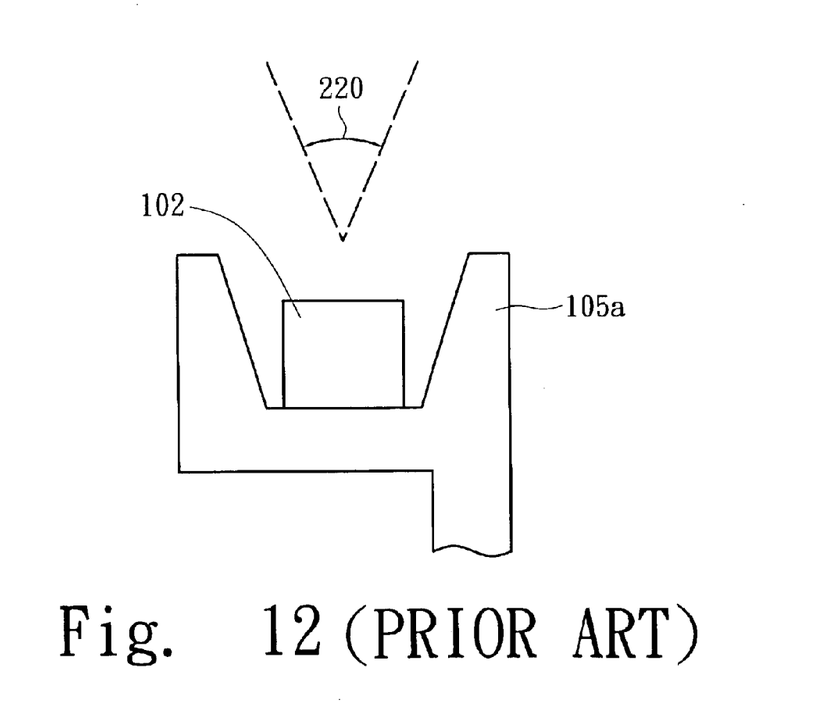
FIG. 12 is a schematic diagram showing the base portion of the conventional LED, wherein the possible range of the emitting angle is further illustrated.

Moreover, the base 14 in the present invention can further be designed as the reflective surface 42 as shown in FIG. 11, wherein the light coming from different directions can be reflected by the reflective surface 42 to be the reflected light having a half angle 210, i.e. the incident light from all different directions can be totally controlled in the direction towards the left. Hence, the design of the base 14 using this principle can easily reflect the light arbitrarily to the left; to the right; to the top; or to the bottom without sacrificing any light force. Further, such as the conventional method shown in FIG. 12, the emitting angle is a full angle 220. Hence, it is very difficult to control the light merely inclining to the left hemisphere; to the right hemisphere; to the upper hemisphere; or to the lower hemisphere by using the conventional method.

Figure 13:
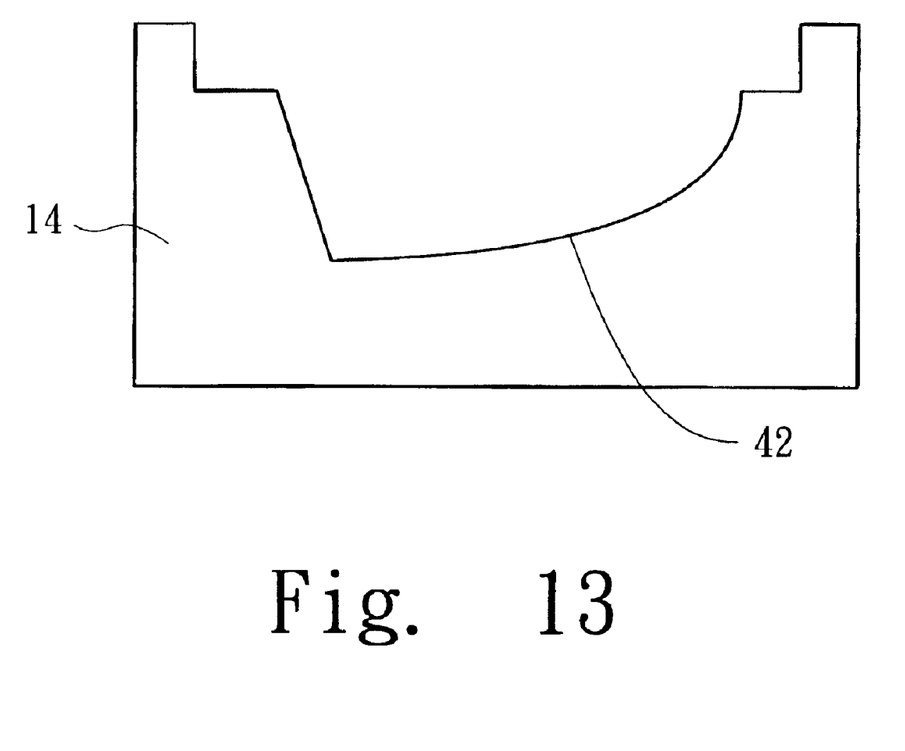
FIG. 13 is a schematic diagram showing a base of an optoelectronic device having a photosensitive element, according to another preferred embodiment of the present invention, wherein the reflective surface is a semiconcave curved surface.

Further, if it is necessary for the photodiode, the base 14 having the reflective surface 42 with a semiconcave curved surface can also be designed, wherein the base 14 can receive light with half angle, i.e. if it is known that some light is only emitted within a specific direction, then the optoelectronic device with this design can receive or stimulate signals in accordance with a certain direction. Consequently, comparing to the conventional design that needs to use the angle twice as much as the present invention, the structure of the base 14 of the present invention shown in FIG. 13 can effectively improve the S/N ratio, and can accurately control the light entering the base 14 for assuring that only the light from specific directions is allowed to enter the optoelectronic element.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A base of an optoelectronic device, said optoelectronic device comprising said base, a transparent conductive substrate and an optoelectronic element, wherein said optoelectronic device is disposed on said transparent conductive substrate, and said base of said optoelectronic device comprises:

a base main body having an opening, wherein said opening is used for accommodating said optoelectronic element, and said transparent conductive substrate covers said opening; and a reflective surface, located at a bottom of said opening, wherein a material is filled in said opening, and said material is selected from a group consisting of gas, colloid and electrically non-conductive liquid.

2. The base of the optoelectronic device according to claim 1, wherein said optoelectronic element is a light-emitting element, and said reflective surface reflects a light emitted from said optoelectronic element.

3. The base of the optoelectronic device according to claim 1, wherein said optoelectronic element is a photosensitive element, and said reflective surface reflects an incident light to said optoelectronic element.

4. The base of the optoelectronic device according to claim 1, further comprising a light-reflective layer formed on an inner wall of said opening.

5. The base of the optoelectronic device according to claim 1, further comprising a fluorescent layer that is formed on said reflective surface for changing a wavelength of a light emitted to said reflective surface.

6. The base of the optoelectronic device according to claim 1, further comprising:

a light-reflective layer formed in an inner wall of said opening; and a fluorescent layer formed on said reflective surface, for changing a wavelength of a light emitted to said reflective surface.

7. The base of the optoelectronic device according to claim 1, wherein said reflective surface is selected from a group consisting of a convex curved surface, a concave curved surface and a grating curved surface.

8. The base of the optoelectronic device according to claim 1, wherein the material forming said base main body is selected from a group consisting of ceramic material, metal material, alloy material, crystalline material and semiconductor material.

9. The base of the optoelectronic device according to claim 1, wherein said optoelectronic element is held in a manner of suspending from said reflective surface.

10. The base of the optoelectronic device according to claim 1, further comprising:

a first electrode part, formed on one side of said base main body so as to be electrically connected to one electrode of said transparent conductive substrate; and a second electrode part, formed on the other side of said base main body so as to be electrically connected to the other electrode of said transparent conductive substrate.

11. The base of the optoelectronic device according to claim 10, wherein said first electrode part and said second electrode part are surface mounted devices (SMD).

12. A base of an optoelectronic device, said optoelectronic device comprising said base, a transparent conductive substrate and an optoelectronic element, wherein said optoelectronic device is disposed on said transparent conductive substrate, and said base of said optoelectronic device comprises:

a base main body having an opening, wherein said opening is used for accommodating said optoelectronic element, and said transparent conductive substrate covers said opening;

a reflective surface, located at a bottom of said opening; and a florescent layer, formed on said reflective surface for changing a wavelength of a light emitted to said reflective surface, wherein a material is filled in said opening, and said material is selected from a group consisting of gas, colloid and electrically non-conductive liquid.

13. The base of the optoelectronic device according to claim 12, wherein said optoelectronic element is a light-emitting element, and said reflective surface reflects a light emitted from said optoelectronic element.

14. The base of the optoelectronic device according to claim 12, wherein said optoelectronic element is a photo-sensitive element, and said reflective surface reflects an incident light to said optoelectronic element.

15. The base of the optoelectronic device according to claim 12, further comprising a light-reflective layer formed on an inner wall of said opening.

16. The base of the optoelectronic device according to claim 12, wherein said reflective surface is selected from a group consisting of a convex curved surface, a concave curved surface and a grating curved surface.

17. The base of the optoelectronic device according to claim 12, wherein the material forming said base main body is selected from a group consisting of ceramic material, metal material, alloy material, crystalline material and semiconductor material.

18. The base of the optoelectronic device according to claim 12, further comprising:

a first electrode part, formed on one side of said base main body so as to be electrically connected to one electrode of said transparent conductive substrate; and a second electrode part, formed on the other side of said base main body so as to be electrically connected to the other electrode of said transparent conductive substrate.

19. A base of an optoelectronic device, said optoelectronic device comprising said base, a transparent conductive substrate and an optoelectronic element, wherein said optoelectronic device is disposed on said transparent conductive substrate, and said base of said optoelectronic device comprising:

a base main body having an opening; and a reflective surface, located at a bottom of said opening, wherein said optoelectronic device is selected from a LED (Light-Emitting Diode) lamp, a LED backlight, a LED high power package and a LED cell (COB LED).

20. The base of the optoelectronic device according to claim 19, further comprising a light-reflective layer formed on an inner wall of said opening.

21. The base of the optoelectronic device according to claim 19, further comprising a fluorescent layer that is formed on said reflective surface for changing a wavelength of a light emitted to said reflective surface.

22. The base of the optoelectronic device according to claim 19, further comprising:

a light-reflective layer formed in an inner wall of said opening; and a fluorescent layer formed on said reflective surface, for changing a wavelength of a light emitted to said reflective surface.

23. The base of the optoelectronic device according to claim 19, wherein said reflective surface is selected from a group consisting of a convex curved surface, a concave curved surface and a grating curved surface.

24. The base of the optoelectronic device according to claim 19, wherein the material forming said base main body is selected from a group consisting of ceramic material, metal material, alloy material, crystalline material and semiconductor material.

25. The base of the optoelectronic device according to claim 19, further comprising a material filled in said opening, wherein said material is selected from a group consisting of gas, colloid and electrically non-conductive liquid.

* * * * *